United States Patent
Kao et al.

(10) Patent No.: US 7,443,210 B2
(45) Date of Patent: Oct. 28, 2008

(54) TRANSMISSION CIRCUIT FOR USE IN INPUT/OUTPUT INTERFACE

(75) Inventors: Min Sheng Kao, Hsinchu (TW); Zee Shian Jen, Hsinchu (TW); Jen Ming Wu, Hsinchu (TW); Ching Te Chiu, Hsinchu (TW); Shuo Hung Hsu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 114 days.

(21) Appl. No.: 11/482,731

(22) Filed: Jul. 10, 2006

(65) Prior Publication Data

US 2007/0069769 A1  Mar. 29, 2007

(30) Foreign Application Priority Data

Sep. 26, 2005 (TW) ............................... 94133399 A

(51) Int. Cl.
*H03B 1/00* (2006.01)
(52) U.S. Cl. ..................................... 327/108; 327/563
(58) Field of Classification Search ................ 327/108, 327/112, 308, 323, 328, 563
See application file for complete search history.

(56) References Cited

U.S. PATENT DOCUMENTS

| | | | | |
|---|---|---|---|---|
| 5,903,175 A | * | 5/1999 | Miyashita | 327/218 |
| 6,124,761 A | * | 9/2000 | Robinson et al. | 330/254 |
| 6,366,140 B1 | * | 4/2002 | Warwar | 327/108 |
| 6,404,229 B1 | * | 6/2002 | Barnes | 326/68 |
| 6,633,191 B2 | * | 10/2003 | Hu | 327/323 |

OTHER PUBLICATIONS

S. Galal, et al, "10Gb/s Limiting Amplifier and Laser/Modulator Driver in 0.18μm CMOS Techonology", Dec. 2003, pp. 2138-2146, IEEE Journal of Solid-State Circuits, vol. 38, No. 12.
Yasumoto Tomita et al, "A 10Gb/s Receiver with Equalizer and On-chip ISI Monitor in 0.11μm CMOS", pp. 202-205, 2004 Symposium on VLSI Circuits, Digest of Technical Papers.

* cited by examiner

*Primary Examiner*—Lincoln Donovan
*Assistant Examiner*—Hai L. Nguyen
(74) *Attorney, Agent, or Firm*—Bacon & Thomas, PLLC

(57) ABSTRACT

A transmission circuit includes a first-stage circuit, a second-stage circuit, a negative active feedback circuit and a current buffer. The first-stage circuit includes at least an active MOS device for receiving an input voltage and issuing a first voltage signal. The active MOS device has an inductive feature during operation in a high frequency mode to compensate the first voltage signal. In response to the first voltage signal, the second-stage circuit outputs a first output voltage. The negative active feedback circuit may enhance the bandwidth of the first output voltage. The current buffer may enhance the gain value of the first output voltage. A second voltage signal is issued from the first-stage circuit and compensated by the first output voltage transmitted from the current buffer to enhance the bandwidth and the gain value thereof. In response to the compensated second voltage signal, the second-stage circuit outputs a second output voltage.

14 Claims, 10 Drawing Sheets

TRANSMISSION CIRCUIT FOR USE IN INPUT/OUTPUT INTERFACE

FIELD OF THE INVENTION

The present invention relates to a transmission circuit, and more particularly to a transmission circuit for use in an input/output interface.

BACKGROUND OF THE INVENTION

Recently, the requirement involving in the speed of a processor is gradually increased. For a purpose of achieving high transmission speed, the input/output (I/O) interface of a computer system needs a high bandwidth. In addition, since most electronic products are developed toward minimization, the overall volume of the chips used in the electronic products should be reduced.

Referring to FIG. 1(a), a schematic circuit block diagram of a conventional I/O interface is illustrated. The I/O interface 1 comprises an input buffer 11, an equalizer 12, a gain control circuit 13 and an output buffer 14. The input buffer 11 is employed to receive data in for example a square-wave form. Since the data are readily deteriorated during transmission, the equalizer 12 may enhance the data for various frequencies so as to improve integrity of these data. After processed by the gain control circuit 13, the data are amplified through the output buffer 14, thereby providing a large loading current to the loads such as chips.

FIG. 1(b) is a schematic circuit block diagram illustrating a conventional input buffer or output buffer, as is described in for example S. Galal, and B. Razavi, "10 Gb/s Limiting Amplifier and Laser/Modulator Driver in 0.18 μm CMOS Technology", International Symposium on Solid-State Circuits Conference, pp. 188-189, February 2003. The input buffer 11 or the output buffer 14 shown in FIGS. 1(a) and 1(b) is a typical current mode logic (CML) buffer circuit, which includes passive inductors L1 and a normal negative active feedback circuit 110.

Please refer to FIGS. 1(c) and 1(d), which are simulation results of the buffer 11 or 14 operated in a low bandwidth (1 Gb/s) mode and a high bandwidth mode (10 Gb/s), respectively. In FIG. 1(c), the waveform of the buffer operated in the low bandwidth is substantially kept unchanged, which means a low power loss. Whereas, in the high bandwidth mode, the waveform is changed from the square wave to an approximately triangular wave, as can be seen in FIG. 1(d). The substantial distortion of data in the high bandwidth mode is undesirable. By the way, the passive inductors L1 occupy much layout area of the chip and are detrimental to minimization of the electronic product.

FIG. 1(e) is a schematic circuit block diagram illustrating a conventional equalizer, as is described for example in Yasumoto Tomita, Masaya Kibune, Junji Ogawa, and William W. Walker, "A 10 Gb/s Receiver with Equalizer and On-chip ISI Monitor in 0.11 μm CMOS", VLSI Circuits, 2004. Digest of Technical Papers. The equalizer 12 comprises a first-stage transconductance circuit 121 and a second-stage transconductance circuit 122. The first-stage transconductance circuit 121 includes a passive capacitor Cc. The second-stage transconductance circuit 122 includes a normal negative active feedback 1221. As known, when the equalizer 12 is operated in a low bandwidth (1 Gb/s) mode, power loss of the data is still low. Whereas, in the high bandwidth mode, the waveform has substantial distortion. By the way, the passive capacitor Cc occupies much layout area of the chip and is detrimental to minimization of the electronic product.

In views of the above-described disadvantages, the applicant keeps on carving unflaggingly to develop a transmission circuit according to the present invention through wholehearted experience and research.

SUMMARY OF THE INVENTION

It is an object of the present invention to provide a transmission circuit for use in an input/output interface, which occupies a reduced chip area.

It is another object of the present invention to provide a transmission circuit for use in an input/output interface in order to compensate the voltage signals, enhance the bandwidth and increase the gain value during operation in a high frequency level.

In accordance with an aspect of the present invention, there is provided a transmission circuit for use in an input/output interface. The transmission circuit comprises a first-stage circuit, a second-stage circuit, a negative active feedback circuit and a current buffer. The first-stage circuit comprises at least an active MOS device for receiving an input voltage and issuing a first voltage signal. The active MOS device has an inductive feature during operation in a high frequency mode to compensate the first voltage signal. The second-stage circuit is electrically connected to the first-stage circuit for outputting a first output voltage in response to the first voltage signal. The negative active feedback circuit is electrically connected to the second-stage circuit for receiving the first output voltage and enhancing the bandwidth of the first output voltage. The current buffer is included in the negative active feedback circuit and electrically connected to the first-stage circuit and the second-stage circuit for receiving the first output voltage and enhancing the gain value of the first output voltage. A second voltage signal is issued from the first-stage circuit and compensated by the first output voltage transmitted from the current buffer to enhance the bandwidth and the gain value thereof, and then a second output voltage is outputted from the second-stage circuit in response to the compensated second voltage signal.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
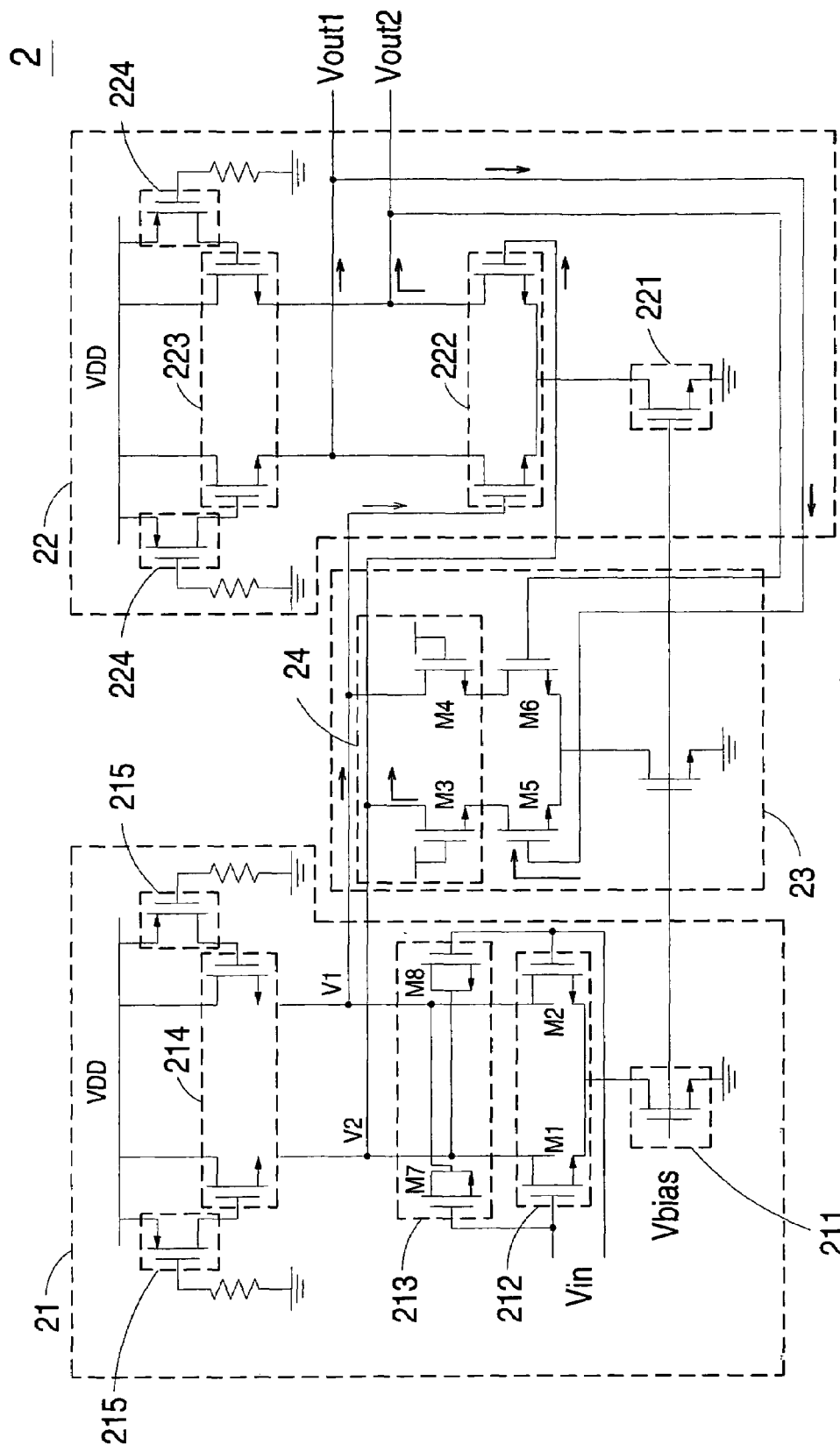
FIG. 2(a) is a schematic circuit block diagram of a transmission circuit according to a first preferred embodiment of the present invention.

Referring to FIG. 2(a), a schematic circuit block diagram of a transmission circuit according to a first preferred embodiment of the present invention is illustrated. The transmission circuit is a current mode logic (CML) buffer circuit and applicable as an input or output buffer of an I/O interface. The CML buffer circuit 2 of FIG. 2(a) comprises a first-stage circuit 21, a second-stage circuit 22 and a negative active feedback circuit 23 including an active current buffer 24.

The first-stage circuit 21 comprises a current source 211, a switch 212, a capacitor 213, a load 214 and an active metal oxide semiconductor (active MOS) device 215. The current source 211 is used for receiving a biased voltage Vbias, and is electrically connected to the switch 212. The switch 212 includes two MOS devices M1 and M2 for receiving an input voltage Vin, and is electrically connected to the capacitor 213. The load 214 receives a biased voltage VDD, and is electrically connected to the active MOS device 215 and the capacitor 213. An example of the active MOS device 215 includes a PMOS or NMOS device.

The second-stage circuit 22 comprises a current source 221, a switch 222, a load 223 and a MOS device 224. The current source 221 is electrically connected to the switch 222. The switch 222 includes two MOS devices, and is electrically connected to the MOS devices M1 and M2 of the switch 212 of the first-stage circuit 21 and the current buffer 24 to receive the voltage signal transmitted from the first-stage circuit 21. The switch 222 is also electrically connected to the load 223 and the voltage output terminal for transmitting an output voltage Vout. The load 223 receives the biased voltage VDD, and is electrically connected to the MOS device 224. An example of the MOS device 224 includes a PMOS or NMOS device.

The negative active feedback circuit 23 is arranged between the first-stage circuit 21 and the second-stage circuit 22. One of the output voltages Vout1 and Vout2 is transmitted to the negative active feedback circuit 23, transmitted through the MOS device M5 or M6 to enhance the bandwidth of the output voltage, and then transmitted through the MOS device M3 or M4 to increase the gain value of the output voltage Vout1 or Vout2. Under this circumstance, the output voltage Vout1 or Vout2 is advantageous for compensating the bandwidth and the gain value of the voltage signal from the first-stage circuit 21. Afterward, the compensated voltage signal is transmitted through the two MOS devices of the switch 222 and then outputted from the other voltage output terminal.

For example, a voltage signal V1 is outputted from the first-stage circuit 21 when a switching operation occurs between the MOS devices M1 and M2. The active MOS device 215 functions as an inductor during operation in a high frequency level such as 10 Gb/s, so that the bandwidth of the voltage signal V1 is somewhat compensated. Afterward, the compensated voltage signal V1 is transmitted through the one MOS device of the switch 222 and then outputted from the voltage output terminal Vout1 of the second-stage circuit 22.

The output voltages Vout1 is transmitted to the negative active feedback circuit 23, transmitted through the MOS device M5 or M6 to enhance the bandwidth of the output voltage, and then transmitted through the MOS device M3 or M4 to increase the gain value of the output voltage Vout1. Under this circumstance, the output voltage Vout1 is advantageous for compensating the bandwidth and the gain value of the other voltage signal V2 from the first-stage circuit 21. Afterward, the compensated voltage signal V2 is transmitted through the two MOS devices of the switch 222 and then an output voltage Vout2 is outputted from the other voltage output terminal. Likewise, the output voltage Vout2 will be transmitted to the negative active feedback circuit 23 and the current buffer 24 to enhance the bandwidth and the gain value of the output voltage Vout2, thereby compensating the voltage signal from the first-stage circuit 21. As a consequence, the inductive feature of the active MOS device 215 facilitates compensating the bandwidth of the voltage signal V1 during operation in a high frequency level, and the negative active feedback circuit 23 and the current buffer 24 is helpful to enhance the bandwidth and the gain value, so that the signal integrity of the CML buffer circuit 2 is very perfect. Moreover, since the active MOS device 215 is much smaller than the passive inductor L1 used in the prior art, this technology can reduce about 80% chip area.

Figure 1A:
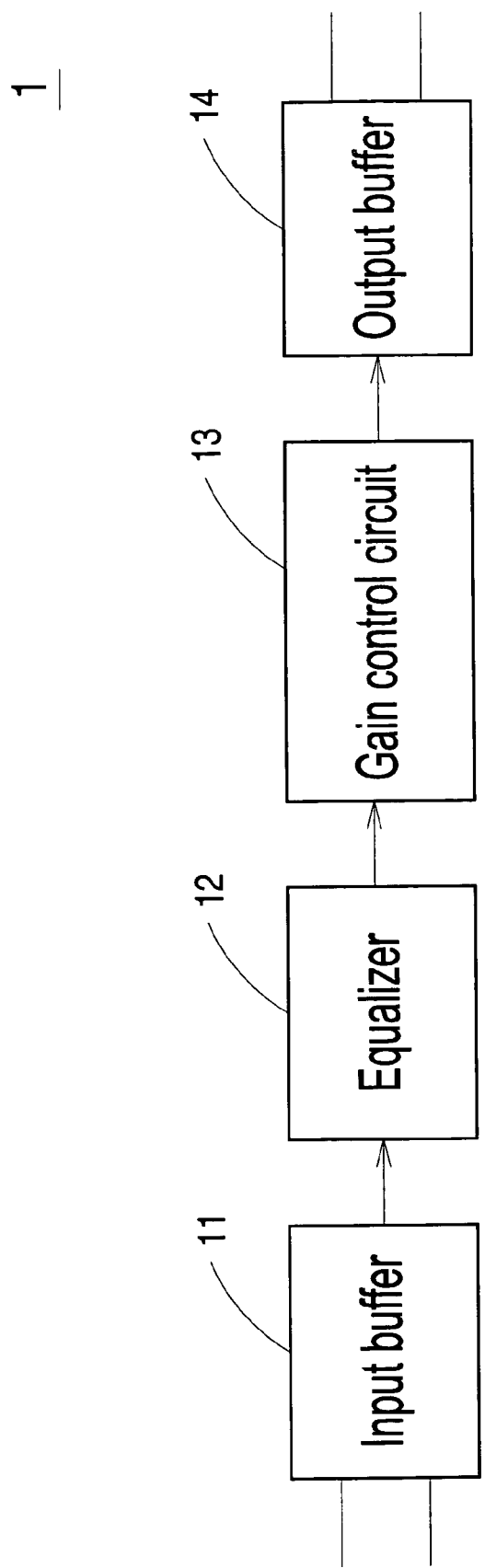
FIG. 1(a) is a schematic circuit block diagram of a conventional I/O interface.
Figure 1B:
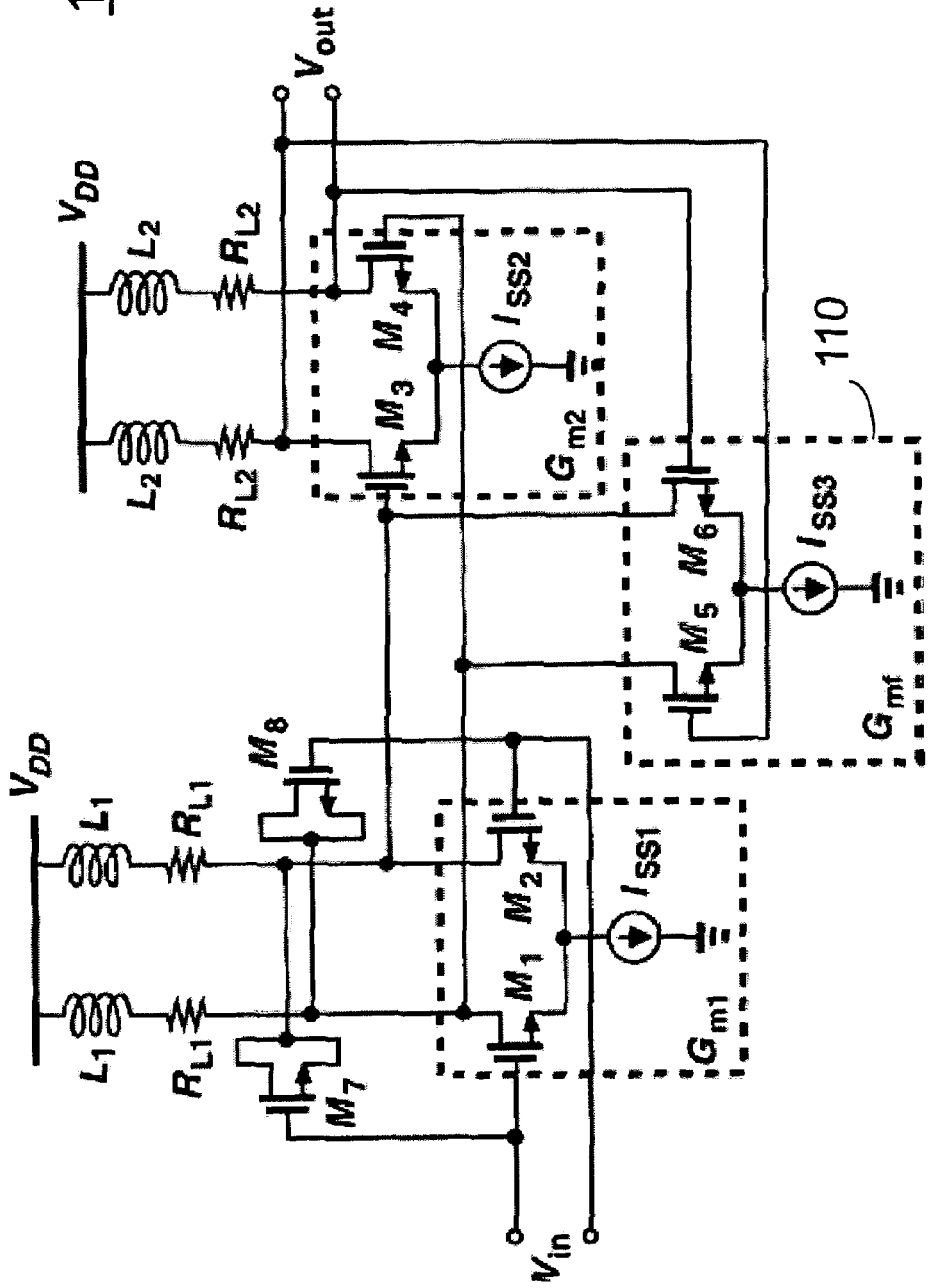
FIG. 1(b) is a schematic circuit block diagram illustrating a conventional input buffer or output buffer.
Figures 1C, 1D:
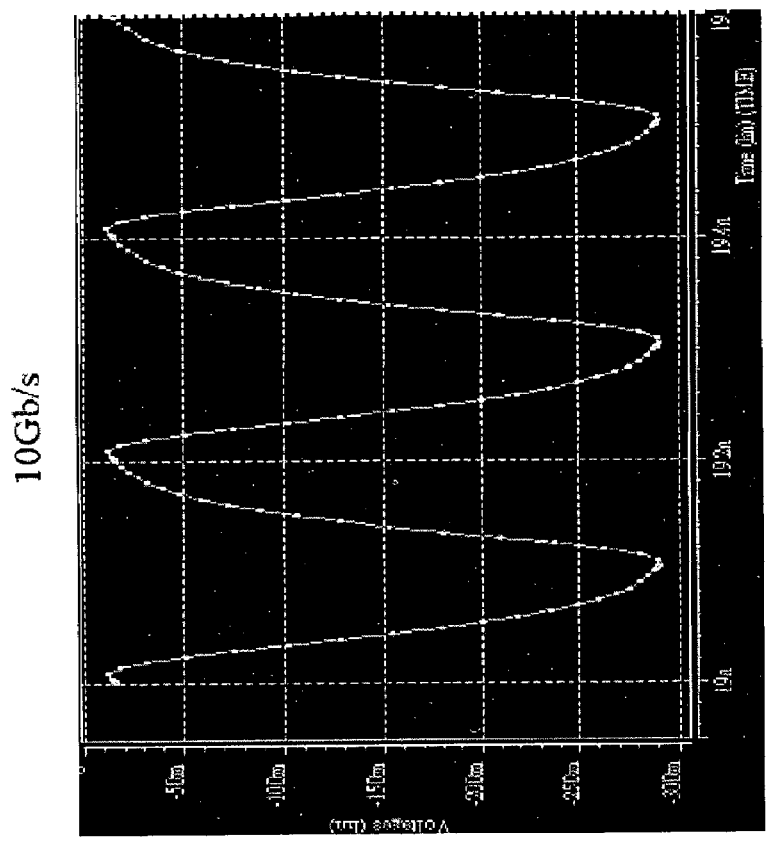
FIGS. 1(c) and 1(d) are simulation results of the buffer operated in a low bandwidth (1 Gb/s) mode and a high bandwidth mode (10 Gb/s), respectively.
Figure 1E:
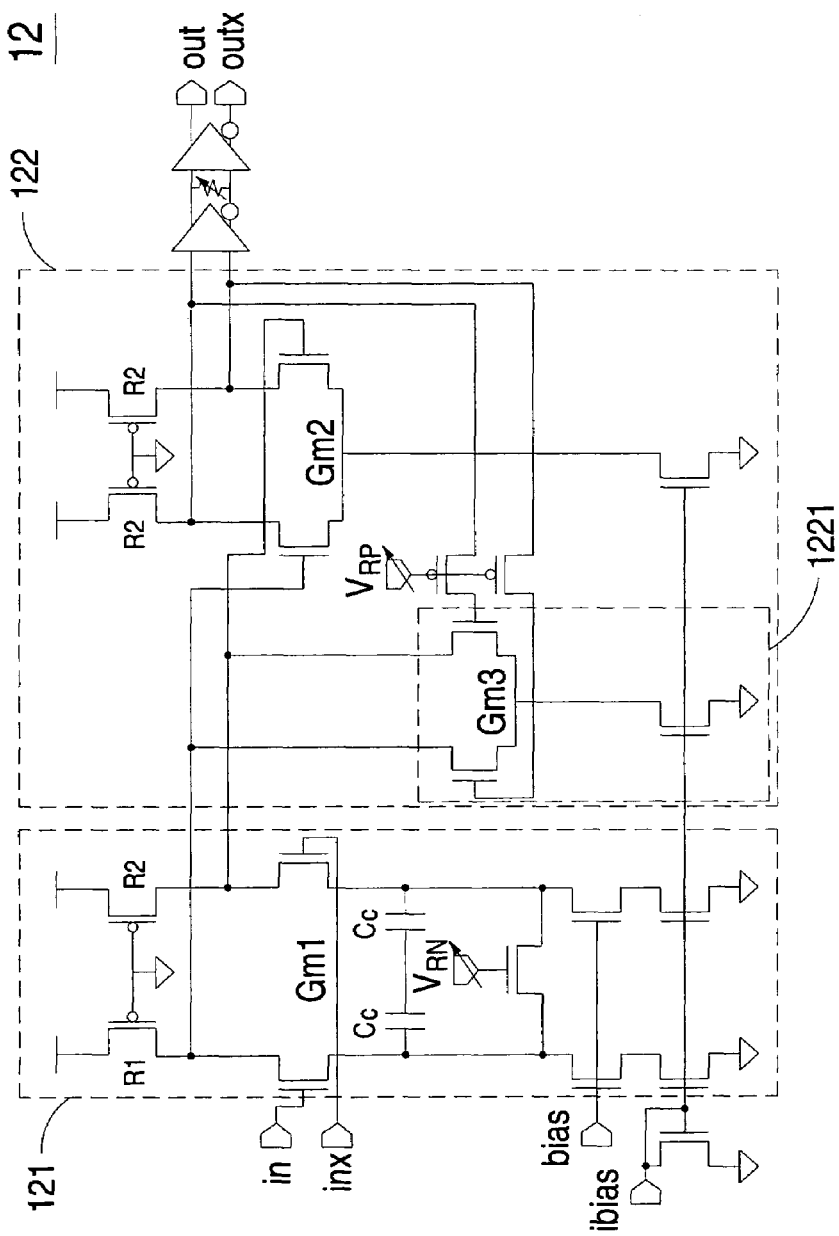
FIG. 1(e) is a schematic circuit block diagram illustrating a conventional equalizer.
Figure 2C:
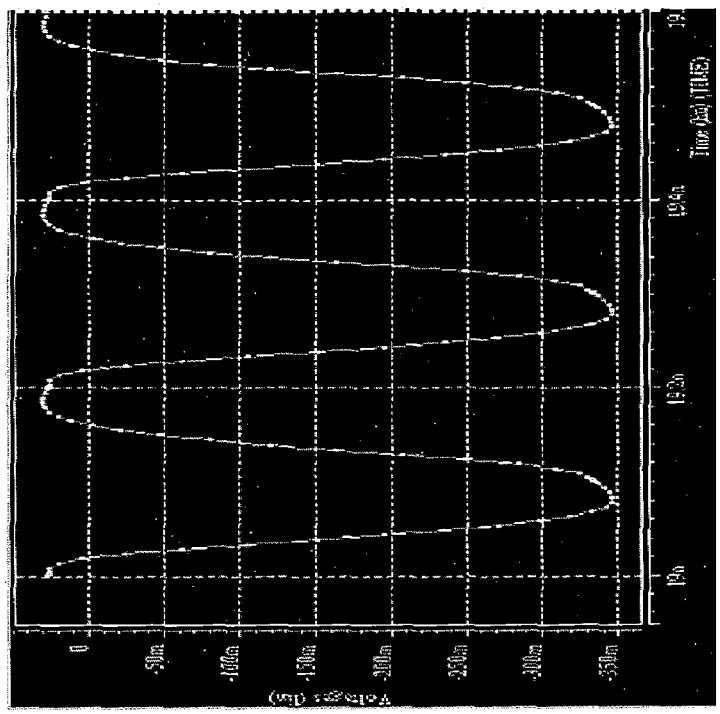
FIG. 2(c) is a simulation result of the transmission circuit of FIG. 2(a) excluding the active current buffer and operated in a high bandwidth mode (10 Gb/s)
Figure 2B:
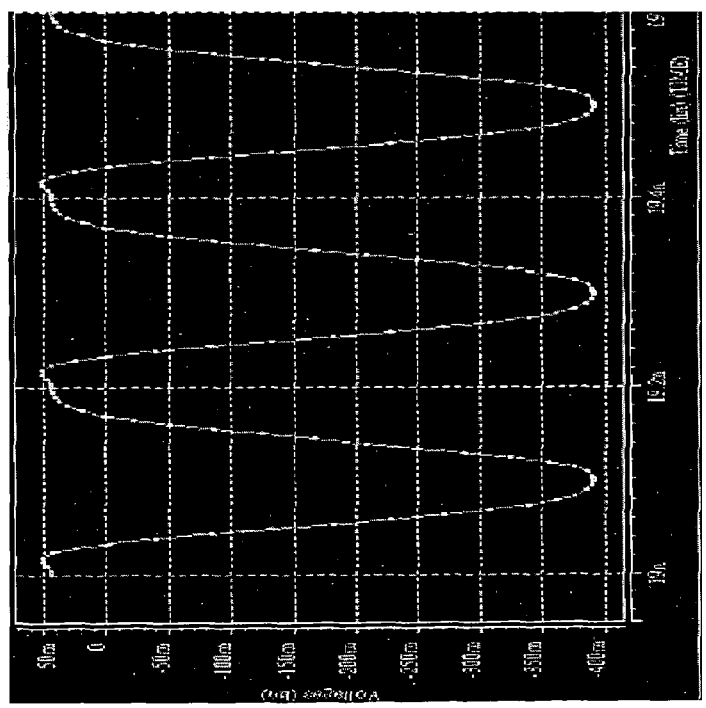
FIG. 2(b) is a simulation result of the buffer shown in FIG. 1(b) and operated in a high bandwidth mode (10 Gb/s) where the inductors Li are replaced by corresponding active MOS devices.

Please refer to FIG. 2(b), which is a simulation result of the input buffer or output buffer shown in FIG. 1(b) and operated in a high bandwidth mode (10 Gb/s) where the inductors Li are replaced by corresponding active MOS devices. In the simulation result of FIG. 2(b), the bandwidth is enhanced and the waveform is largely improved when compared with the simulation of FIG. 1(d). Furthermore, the gain value is increased because the range between the maximum output voltage and the minimum output voltage (50 m~−390 m) is significantly larger than the output voltage range of FIG. 1(d), i.e. −10 m~−290 m.

FIG. 2(c) illustrates the simulation result of the transmission circuit 2 shown in FIG. 2(a) excluding the active current buffer 24 and operated in a high bandwidth mode (10 Gb/s). In the simulation result of FIG. 2(c), the bandwidth is wider and rising rate of the waveform is faster than the simulation of FIG. 2(b).

Figure 2D:
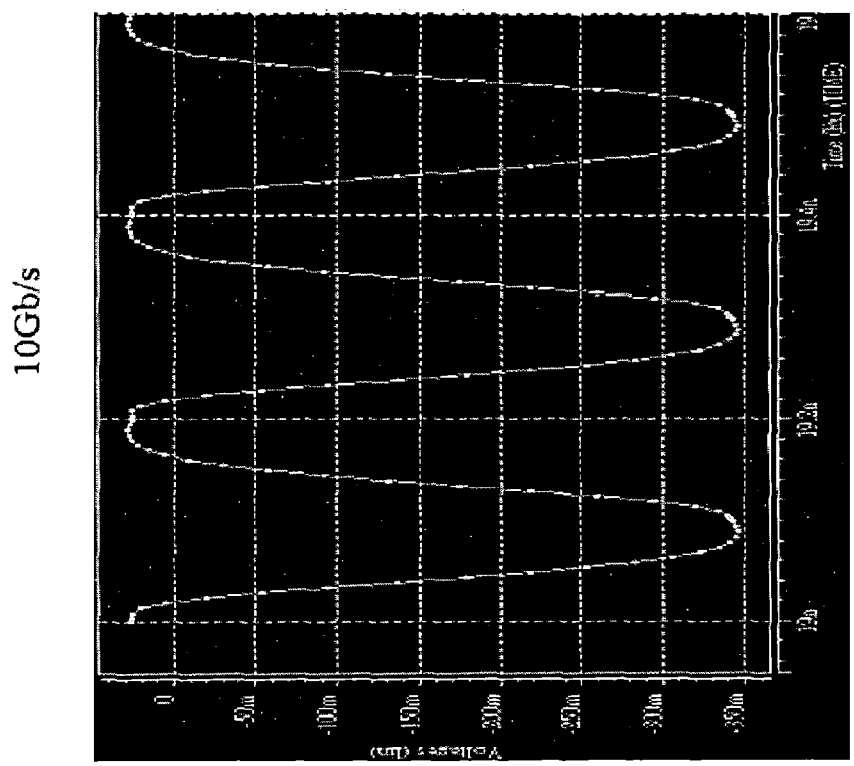
FIG. 2(d) is a simulation result of the transmission circuit of FIG. 2(a) and operated in a high bandwidth mode (10 Gb/s)

FIG. 2(d) is a simulation result of the transmission circuit 2 shown in FIG. 2(a) and operated in a high bandwidth mode (10 Gb/s). When compared with the simulation of FIG. 2(c), the bandwidth of FIG. 2(d) is further enhanced and the gain value and the linearity of the waveform are increased. In other words, the waveform of FIG. 2(d) is close to the square wave.

Figure 3A:
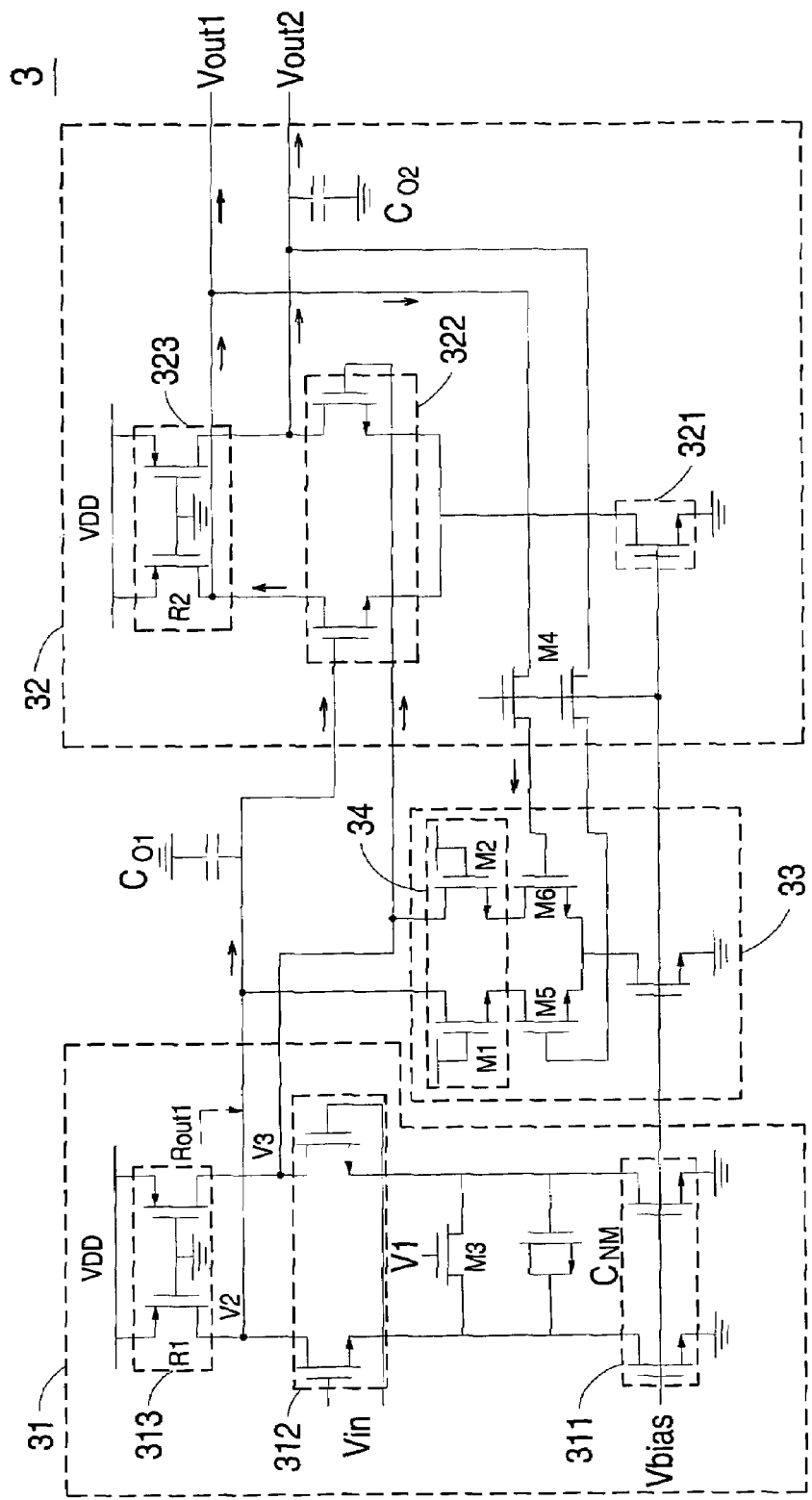
FIG. 3(a) is a schematic circuit block diagram of a transmission circuit according to a second preferred embodiment of the present invention.
Figure 3B:
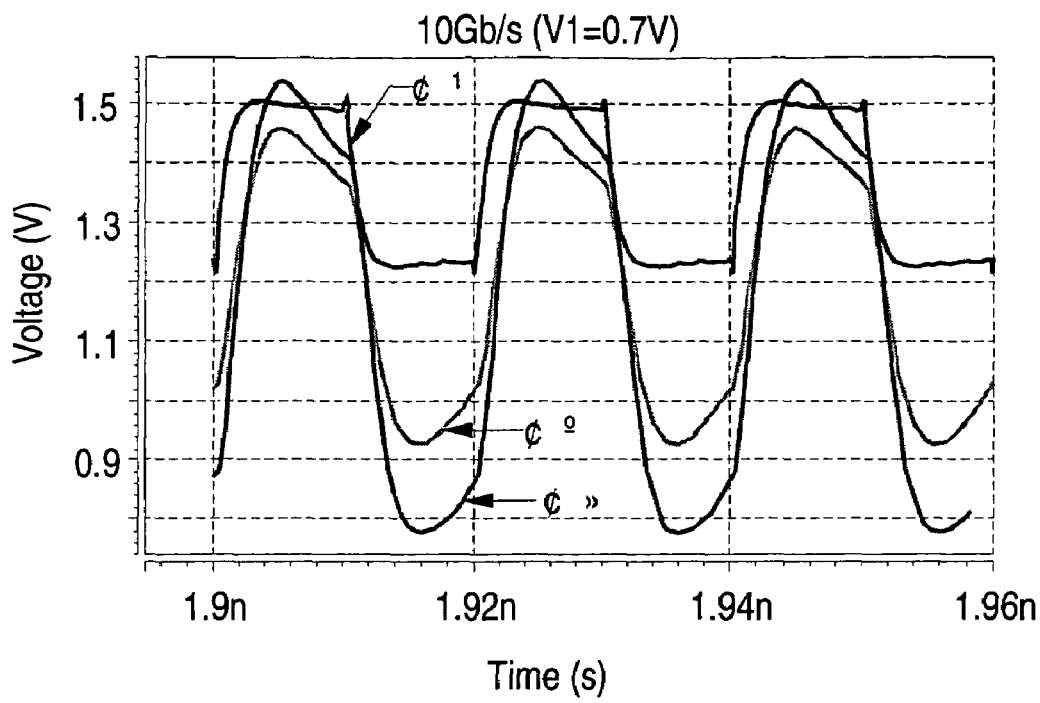
FIG. 3(b) illustrates the simulation results of three transmission circuits operated in a high bandwidth mode (10 Gb/s)
Figure 3C:
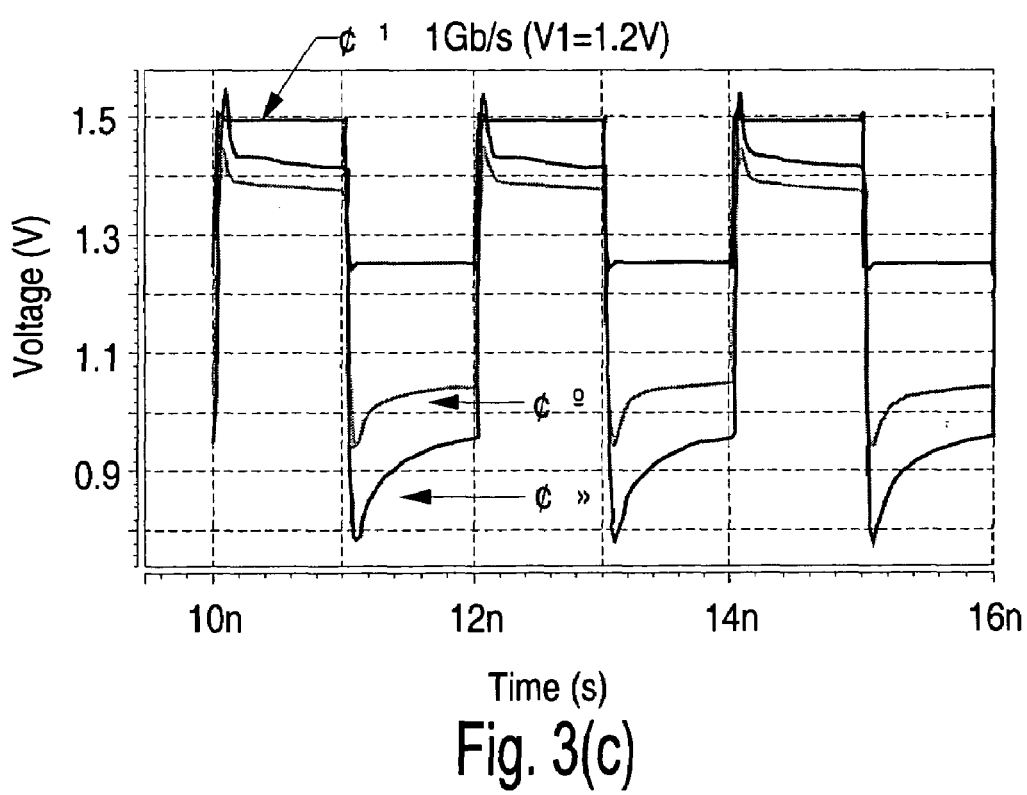
FIG. 3(c) illustrates the simulation results of three transmission circuits operated in a low bandwidth mode (1 Gb/s)
Figure 3D:
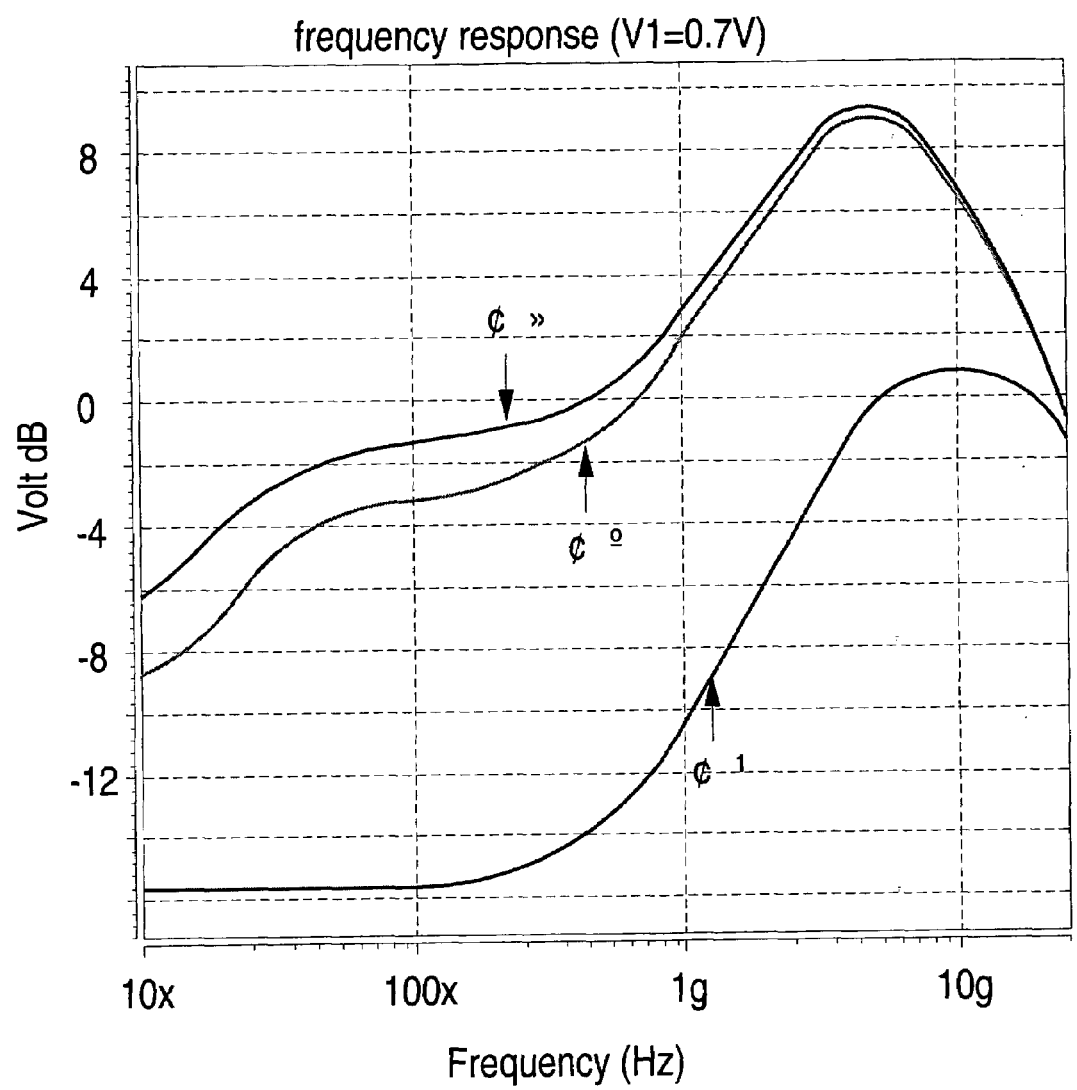
FIG. 3(d) illustrates the frequency domain waveform of three transmission circuits.

Referring to FIG. 3(a), a schematic circuit block diagram of a transmission circuit according to a second preferred embodiment of the present invention is illustrated. The transmission circuit is applicable as an equalizer of an I/O interface. The equalizer 3 of FIG. 3(a) comprises a first-stage circuit 31, a second-stage circuit 32 and a negative active feedback circuit 33 including an active current buffer 34.

The first-stage circuit 31 comprises a current source 311, a switch 312, a load 313 and two active MOS devices $C_{NM}$ and M3. The current source 311 is used for receiving a biased voltage Vbias, and is electrically connected to the switch 312 and the active MOS devices $C_{NM}$ and M3. The switch 312 includes two MOS devices for receiving an input voltage Vin, and is electrically connected to the load 313. The load 313 receives a biased voltage VDD. The MOS device M3 is used for receiving a voltage signal V1. By controlling the voltage signal V1, the gain value of the output voltage V2 or V3 for the first-stage circuit 31 is adjustable.

The second-stage circuit 32 comprises a current source 321, a switch 322, a load 323 and a MOS device M4. The current source 321 is electrically connected to the switch 322. The switch 322 includes two MOS devices, and is electrically connected to the MOS devices of the switch 312 of the first-stage circuit 31 and the current buffer 34 to receive the voltage signal transmitted from the first-stage circuit 31. The switch 322 is also electrically connected to the load 323 and the voltage output terminal for transmitting an output voltage Vout1 or Vout2.

The negative active feedback circuit 33 is arranged between the first-stage circuit 31 and the second-stage circuit 32. One of the output voltages Vout1 and Vout2 is transmitted to the negative active feedback circuit 33, transmitted through the MOS device M5 or M6 to enhance the bandwidth of the output voltage, and then transmitted through the MOS device M1 or M2 of the active current buffer 34 to increase the gain value of the output voltage Vout1 or Vout2. Under this circumstance, the output voltage Vout1 or Vout2 is advantageous for compensating the bandwidth and the gain value of the voltage signal from the first-stage circuit 31. Afterward, the compensated voltage signal is transmitted through the two MOS devices of the switch 322 of the second-stage circuit 32 and then outputted from the other voltage output terminal.

For example, a voltage signal V2 is outputted from the first-stage circuit 31 when a switching operation occurs between the MOS devices of the switch 312. The voltage signal V2 is transmitted through one MOS device of the switch 322 and then outputted from the voltage output terminal Vout1 of the second-stage circuit 32.

The output voltages Vout1 is transmitted through the MOS devices of the negative active feedback circuit 33 to enhance the bandwidth of the output voltage, and then transmitted through the MOS device M1 or M2 of the active current buffer 34 to increase the gain value of the output voltage Vout1. Under this circumstance, the output voltage Vout1 is advantageous for compensating the bandwidth and the gain value of the other voltage signal V3 from the first-stage circuit 31. Afterward, the compensated voltage signal V3 is transmitted through the MOS devices of the switch 322 and then an output voltage Vout2 is outputted from the other voltage output terminal. Likewise, the output voltage Vout2 will be transmitted to the negative active feedback circuit 33 and the current buffer 34 to enhance the bandwidth and the gain value of the output voltage Vout2, thereby compensating the voltage signal from the first-stage circuit 31. As a consequence, even when the equalizer 3 is operated in a low frequency mode (e.g. 1 Gb/s) or in a high frequency mode (e.g. 10 Gb/s), the voltage signal V2 or V3 from the first-stage circuit 31 are compensated by the current buffer 34 and the negative active feedback circuit 33 to enhance the bandwidth and the gain value of the output voltage, so that the signal integrity of the equalizer 3 is largely improved. Moreover, since the active MOS device $C_{NM}$ in replace of the capacitor Cc used in the prior art (as shown in FIG. 1($e$)) is smaller than the capacitor Cc, the reduced chip area is advantageous for minimization of the product.

Referring to FIGS. 3($b$) and 3($c$), the simulation results of three transmission circuits operated in a high bandwidth mode (10 Gb/s) and in a low bandwidth mode (1 Gb/s) are respectively shown. The voltage V1 applied to the MOS device M3 is 0.7V in the high bandwidth mode or 1.2 in the low bandwidth mode. The simulation result of curve I is related to the conventional equalizer as shown in FIG. 1($e$). The curve II is the simulation result of the equalizer 3 of FIG. 3($a$) without the current buffer 34. Whereas, the curve III exhibits the simulation result of the equalizer 3 of FIG. 3($a$). In the high bandwidth mode (10 Gb/s), it is demonstrated that the simulation result of the curve III is the most satisfactory because the range between the maximum output voltage and the minimum output voltage (0.8V~1.5V) is significantly wider than the prior art (1.2V~1.5V). Similarly, in the low bandwidth mode (1 Gb/s), the simulation result of the curve III has a wider output voltage range (0.9V~1.5V) than the prior art (1.2V~1.5V). Referring to FIG. 3($d$), the frequency domain waveforms of three transmission circuits are shown. The voltage V1 applied to the MOS device M3 is 0.7V in the high bandwidth mode. The curve I is related to the conventional equalizer as shown in FIG. 1($e$). The curve II is related to the equalizer 3 of FIG. 3($a$) without the current buffer 34. Whereas, the curve III is related to the equalizer 3 of FIG. 3($a$). In the high bandwidth mode (10 Gb/s), it is demonstrated that the frequency domain waveform of the curve III is the most satisfactory because the equalizer 3 of FIG. 3($a$). can make significant compensation on high frequency signal loss, increasing gain and linearity.

From the above description, the transmission circuit for use in an input/output interface according to the present invention is capable of compensating the bandwidth of the voltage signal from the first-stage circuit due to the inductive feature of the active MOS device during operation in a high frequency level. In addition, the negative active feedback circuit and the current buffer are helpful to enhance the bandwidth and the gain value, so that the signal integrity of the transmission circuit is very perfect. Moreover, since the active MOS device is much smaller than the passive inductor used in the prior art, the reduced chip area is advantageous for minimization of the product.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A transmission circuit for use in an input/output interface, said transmission circuit comprising:

a first-stage circuit comprising at least an active MOS device for receiving an input voltage and issuing a first voltage signal, wherein said active MOS device has an inductive feature during operation in a high frequency mode to compensate said first voltage signal;

a second-stage circuit electrically connected to said first-stage circuit for outputting a first output voltage in response to said first voltage signal;

a negative active feedback circuit electrically connected to said second-stage circuit for receiving said first output voltage and enhancing the bandwidth of said first output voltage; and a current buffer included in said negative active feedback circuit and electrically connected to said first-stage circuit and said second-stage circuit for receiving said first output voltage and enhancing the gain value of said first output voltage, wherein a second voltage signal is issued from said first-stage circuit and compensated by said first output voltage transmitted from said current buffer to enhance the bandwidth and the gain value thereof, and a second output voltage is outputted from said second-stage circuit in response to said compensated second voltage signal.

2. The transmission circuit according to claim 1 wherein said active MOS device of said first-stage circuit is an active PMOS device.

3. The transmission circuit according to claim 1 wherein said active MOS device of said first-stage circuit is an active NMOS device.

4. The transmission circuit according to claim 1 being a current mode logic buffer circuit.

5. The transmission circuit according to claim 4 wherein said first-stage circuit comprises:

a first current source for receiving a biased voltage;

at least a capacitor;

at least a first switch receiving said input voltage, and electrically connected to said first current source and said capacitor; and at least a first load electrically connected to said active MOS device and said capacitor.

6. The transmission circuit according to claim 5 wherein said second-stage circuit comprises a second current source, at least a second switch and at least an active MOS device, wherein said second switch receives said first and second voltage signals and is electrically connected to said second current source, and said load is electrically connected to said active MOS device.

7. The transmission circuit according to claim 6 wherein said active MOS device of said second-stage circuit is an active PMOS device.

8. The transmission circuit according to claim 6 wherein said active MOS device of said second-stage circuit is an active NMOS device.

9. A transmission circuit for use in an input/output interface, said transmission circuit comprising:

a first-stage circuit for receiving an input voltage and issuing a first voltage signal;

a second-stage circuit electrically connected to said first-stage circuit for outputting a first output voltage in response to said first voltage signal;

a negative active feedback circuit electrically connected to said second-stage circuit for receiving said first output voltage and enhancing the bandwidth of said first output voltage; and a current buffer included in said negative active feedback circuit and electrically connected to said first-stage circuit and said second-stage circuit for receiving said first output voltage and enhancing the gain value of said first output voltage, wherein a second voltage signal is issued from said first-stage circuit and compensated by said first output voltage transmitted from said current buffer to enhance the bandwidth and the gain value thereof, and a second output voltage is outputted from said second-stage circuit in response to said compensated second voltage signal.

10. The transmission circuit according to claim 9 being an equalizer.

11. The transmission circuit according to claim 10 wherein said first-stage circuit comprises:

a first current source for receiving a first biased voltage;

at least an active MOS device;

at least a first switch receiving said input voltage, and electrically connected to said first current source and said active MOS device; and at least a first load receiving a second biased voltage and electrically connected to said first switch.

12. The transmission circuit according to claim 11 wherein said active MOS device of said first-stage circuit is an active PMOS device.

13. The transmission circuit according to claim 11 wherein said active MOS device of said first-stage circuit is an active NMOS device.

14. The transmission circuit according to claim 11 wherein said second-stage circuit comprises a second current source, at least a second switch and at least an active MOS device, wherein said second switch receives said first and second voltage signals and is electrically connected to said second current source, and said load is electrically connected to said second switch.

* * * * *